United States Patent [19]

Paxman et al.

[11] Patent Number: 4,881,119

[45] Date of Patent: Nov. 14, 1989

[54] SEMICONDUCTOR DEVICES

[75] Inventors: David H. Paxman, Redhill; John A. G. Slatter, Crawley Down; David J. Coe, East Grinstead, all of England

[73] Assignee: U.S. Philips Corp., New York, N.Y.

[21] Appl. No.: 306,243

[22] Filed: Feb. 2, 1989

Related U.S. Application Data

[63] Continuation of Ser. No. 46,972, May 5, 1987, abandoned.

[30] Foreign Application Priority Data

May 16, 1986 [GB] United Kingdom ................. 8612010

[51] Int. Cl.$^4$ ............................................. H01L 27/06
[52] U.S. Cl. ................................. 357/23.4; 357/23.8; 357/43; 357/38; 357/86; 357/44; 357/46
[58] Field of Search ..................... 357/23.4, 23.8, 43, 357/38, 86, 44, 38 T, 46

[56] References Cited

U.S. PATENT DOCUMENTS

| | | | |
|---|---|---|---|
| 4,441,117 | 4/1984 | Zommer | 357/43 |
| 4,618,872 | 10/1986 | Baliga | 357/38 |
| 4,623,910 | 11/1986 | Risberg | 357/38 |
| 4,639,761 | 1/1987 | Singer et al. | 357/37 |
| 4,672,407 | 6/1987 | Nakagawa et al. | 357/37 |

FOREIGN PATENT DOCUMENTS 2524711  10/1983  France .................. 357/43

Primary Examiner—Andrew J. James
Assistant Examiner—David Soltz
Attorney, Agent, or Firm—Steven R. Biren

[57] ABSTRACT

A semiconductor device includes a bipolar transistor having an emitter region of one conductivity type formed in a base region of the opposite conductivity type, the base region being provided in a collector region of the one conductivity type. A first insulated gate field effect transistor provides a gateable connection to the emitter region of the bipolar transistor while a second insulated gate field effect transistor provides a charge extraction path from the base region when the bipolar transistor is turned off. The first insulated gate field effect transistor includes a further region of the other conductivity type provided in the emitter region, and a source region of the one conductivity type formed in the further region and an insulated gate overlying a channel area comprising at least part of the further region to provide a gateable connection between the emitter region and the source region of the first insulated gate field effect transistor. The second insulated gate field effect transistor having an insulated gate overlying a channel area comprising at least part of the emitter region adjacent the base region to provide a gateable connection between the base region and a source of the second insulated gate field effect transistor.

10 Claims, 3 Drawing Sheets

SEMICONDUCTOR DEVICES

This is a continuation of application Serial No. 046,972, filed May 5, 1987, now abandoned.

BACKGROUND OF THE INVENTION

This invention relates to semiconductor devices including both a bipolar transistor and insulated-gate field-effect transistors.

Although majority-carrier devices are intrinsically very much faster than bipolar structures, this speed is acquired at the expense of power handling, particularly for high voltage devices. This disadvantage is associated with the very high parasitic series resistance of the non-conductivity-modulated drain drift region and is a fundamental limitation for a majority carrier device. By way of contrast, bipolar devices are able to trade speed against dissipation through use of life-time killing, base-collector clamping, emitter-shorting and other such techniques for controlling conductivity-modulation or for extracting injected charge. A compromise between the properties of bipolar and majority carrier devices can be achieved by using the two types of device in combination. Background prior art structures of this general type are shown in "IEEE Proceedings of the Power Electronic Specialist Conference", 1983, pp. 144–149, IEEE Pub. 0275-9306/83/0000-0144; U.S. Pat. No. 4,729,007; WO85/04285; EP-A-159663; and WO83/00407.

Semiconductor devices have been proposed which comprise a bipolar transistor having an emitter region of one conductivity type interfacing with a base region of the opposite conductivity type, the base region interfacing with a collector region of the one conductivity type, a first insulated gate field effect transistor providing a gateable connection to the emitter region of the bipolar transistor, and a second insulated gate field effect transistor for providing a charge extraction path from the base region when the bipolar transistor is turned off.

EP-A-180255 describes such a semiconductor device in which four insulated gate field effect transistors are integrated and merged with a bipolar transistor. As described in EP-A-180255, the body of the semiconductor device forms the collector regions of the bipolar transistor and islands of the opposite conductivity type are provided adjacent one surface of the semiconductor body forming, alternately, a base region of the bipolar transistor and a drain region of the first insulated gate field effect transistor so that each base region is surrounded by drain regions of the first field effect transistor. In the discussion below of EP-A-180255 a single base region having on either side a drain region of the first insulated gate field effect transistor will be considered in the interests of simplicity.

As described in EP-A-180255, the first insulated gate field effect transistor has an insulated gate overlying a channel area provided by the body region between the base region and a first one of the two drain regions, so providing a gateable connection to the base region to enable extraction of carriers from the base region when the bipolar transistor is turned off. The emitter region of the bipolar transistor is disposed in the base region remote from the insulated gate of the first insulated gate field effect transistor. A source region of the second insulated gate field effect transistor is disposed in the second drain region adjacent the emitter region and an insulated gate overlies a channel area provided by the second drain region and the base region to provide a gateable connection to the emitter region. The third insulated gate field effect transistor is a vertical device provided by the inclusion of a source region in the base region remote from the emitter region so that the area of the base region underlying the insulated gate of the first insulated gate field effect transistor provides the channel area and the collector or body region forms the drain region of the third insulated gate field effect transistor which acts to provide base drive to the bipolar transistor. The fourth insulated gate field effect transistor is another vertical device with the body region forming the drain region of the device and is disposed in parallel with the bipolar transistor, the source of the second field effect transistor forming the source of the fourth field effect transistor and an area of the drain region of the first field effect transistor underlying the insulated gate of the first field effect transistor forming the channel area of the fourth insulated gate field effect transistor.

SUMMARY OF THE INVENTION

According to the present invention there is provided a semiconductor device comprising a bipolar transistor having an emitter region of one conductivity type interfacing with a base region of the opposite conductivity type, the base region interfacing with a collector region of the one conductivity type, a first insulated gate field effect transistor providing a gateable connection to the emitter region of the bipolar transistor, and a second insulated gate field effect transistor for providing a charge extraction path from the base region when the bipolar transistor is turned off, characterized in that the first insulated gate field effect transistor comprises a source separated from the emitter region by a further region of the opposite conductivity type provided in the emitter region and an insulated gate which overlies a channel area comprising at least part of the further region between the emitter region and the source of the insulated gate field effect transistor to provide the gateable connection, and in that the second insulated gate field effect transistor has an insulated gate overlying a channel area comprising at least part of the emitter region adjacent the base region to provide a gateable connection between the base region and a source of the second insulated gate field effect transistor to provide the charge extraction path from the base region via the second insulated gate field effect transistor when the bipolar transistor is turned off.

Thus in a semiconductor device in accordance with the invention, insulated gate field effect transistors providing, respectively, a gateable connection to the base region and the emitter region of the bipolar transistor are merged with the bipolar transistor, enabling the power handling capabilities of the bipolar transistor to be combined with the switching capabilities of the insulated gate field effect transistor in a very compact and relatively simple structure. Further, since the source of the second insulated gate field effect transistor may comprise part of the further region, or a separate region of the opposite conductivity type formed in the emitter region at the same time as the further region, the merged second insulated gate field effect transistor can be provided without the need for any additional diffusion and/or ion implantation steps.

A third insulated gate field effect transistor may be included to provide base drive for the bipolar transistor. If both the second and the third insulated gate field effect transistors are provided and the two transistors are of complementary conductivity type having a common gate connection, a push-pull input stage for the base region of the bipolar transistor may be provided. The third insulated gate field effect transistor may comprise an insulated gate overlying a channel area comprising part of the base region to provide a gateable connection between a drain region of the one conductivity type and a source of the third insulated gate field effect transistor. The drain region of the third insulated gate field effect transistor may comprise at least part of the collector region of the one conductivity type of the bipolar transistor. Alternatively, the drain region of the third insulated gate field effect transistor may comprise a drain region of the one conductivity type provided in the base region enabling a separate drain connection to be provided to produce a four terminal, rather than a three terminal, device. The source region of the third insulated gate field effect transistor may comprise a source region of the one conductivity type formed in the base region.

Such a merged further insulated gate transistor for providing a charge extraction path for the base region on turn-off of the device cooperates advantageously with the merged insulated gate field effect transistor for providing open-circuit of the emitter region on turn-off of the device to provide an efficient and rapid turn-off of the device.

It should of course be appreciated that the second and third insulated gate field effect transistors only could be provided to provide a push-pull input stage for the bipolar transistor without the emitter gating or that the second insulated gate field effect transistor could be omitted leaving the first and third insulated gate field effect transistors to provide, respectively, emitter gating and base drive.

The bipolar transistor may form part of a larger bipolar device. Thus the collector region of the bipolar transistor may be provided in or on a region of the opposite conductivity type so that the bipolar transistor forms part of a thyristor structure. Such a thyristor structure may be, for example, a gate turn-off thyristor.

It should be noted that U.S. Pat. No. 4,585,962 describes a bipolar switching device having a multiple emitter structure in which insulated gate field effect transistors are integrated or merged within the emitter regions of the bipolar transistor so that the on-resistance of the insulated gate field effect transistors in series with the emitter regions provides emitter ballasting to, as indicated in the specification, eliminate non-uniformity of current density within the bipolar transistor enabling an increase in the effective emitter area and reducing non-conformity in the bias condition between the base and emitter regions of the bipolar transistor.

BRIEF DESCRIPTION OF THE DRAWINGS

In order that the invention may be more readily understood, embodiments thereof will now be described by way of example, with reference to the accompanying drawings, in which.

Figure 1A:
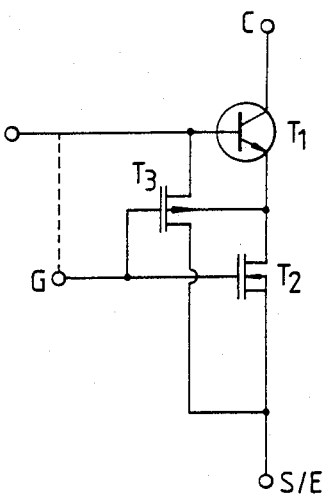
FIG. 1a illustrates the equivalent circuit for the device shown in FIG. 1.
Figure 1:
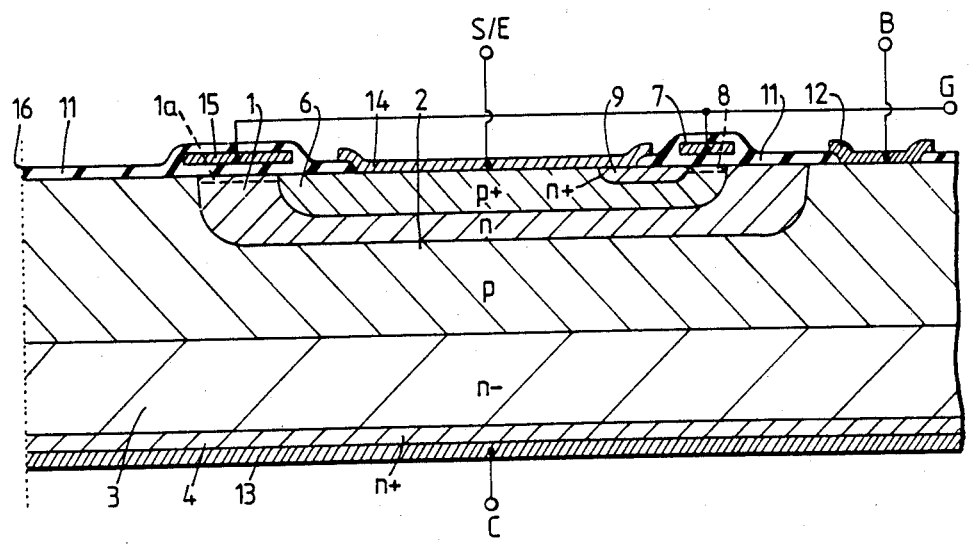
FIG. 1 is a diagrammatic cross-sectional view of a first embodiment of a device in accordance with the invention.
Figure 2A:
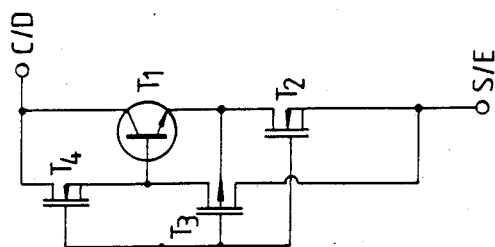
FIG. 2a illustrates the equivalent circuit for the device shown in FIG. 2.
Figure 2:
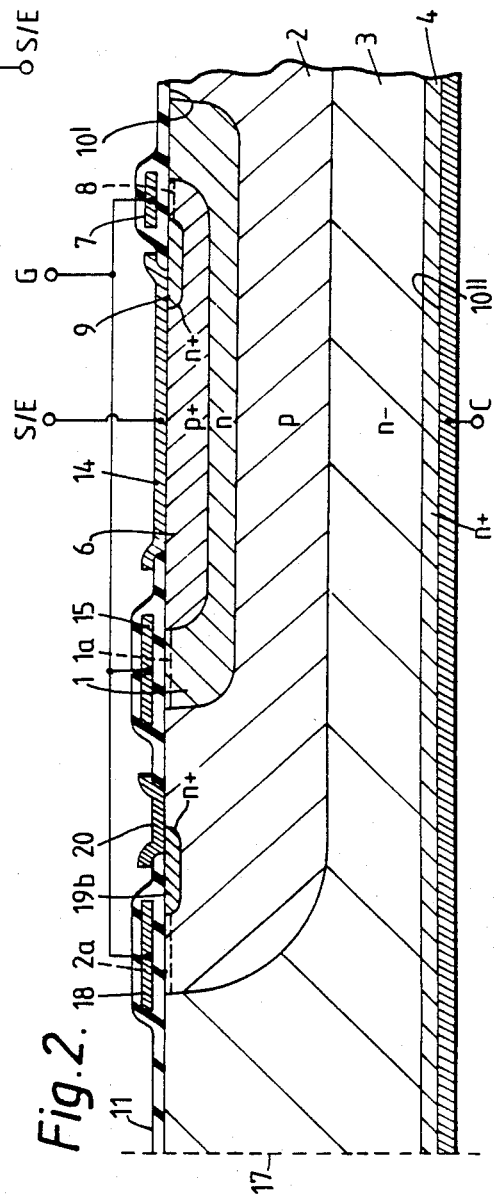
FIG. 2 is a diagrammatic cross-sectional view of a second embodiment of a device in accordance with the invention.
Figure 3:
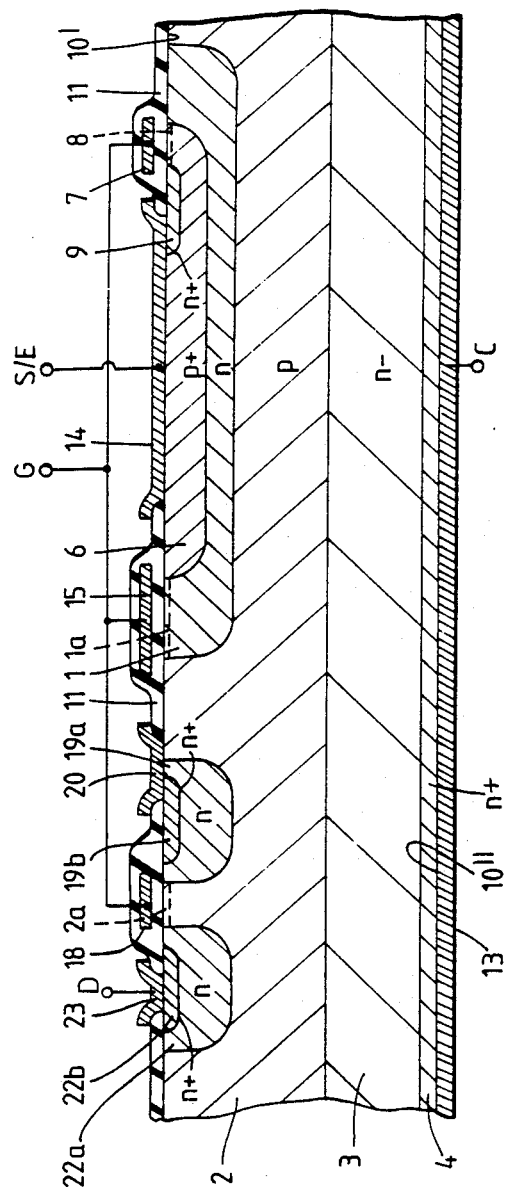
FIG. 3 is a diagrammatic cross-sectional view of a third embodiment of a device in accordance with the invention.

It should, of course, be appreciated that FIGS. 1, 2 and 3 are schematic and are also not drawn to scale and that, in particular, the relative dimensions and proportions may have been increased or decreased for the sake of clarity and ease of understanding. Similar parts are designated in each of the embodiments by the same or similar reference numerals.

DESCRIPTION OF THE PREFERRED EMBODIMENTS

Referring now to the drawings, FIG. 1 is a diagrammatic cross-sectional view of a first embodiment of a semiconductor device in accordance with the invention.

The semiconductor device shown in FIG. 1 comprises a bipolar transistor $T_1$ of vertical configuration having an emitter region 1 of one conductivity type, for example n conductivity type, formed in or provided on a base region 2 of the opposite conductivity type (in this example p conductivity type). The base region 2 is provided in or formed on a body portion of the one conductivity type. In the example shown, the body portion is formed as an n—conductivity type epitaxial layer 3 on a highly doped n+conductivity type substrate 4, the layers 3 and 4 forming a collector region 5 of the bipolar transistor $T_1$.

The device shown in FIG. 1 also comprises a first insulated gate field effect transistor $T_2$ which is merged with the bipolar transistor $T_1$ to form a device having the equivalent circuit shown in FIG. 1a so that the first insulated gate field effect transistor $T_2$ provides a gateable connection to the emitter region 1 of the bipolar transistor $T_1$. The first insulated gate field effect transistor $T_2$ is formed by a further region 6 of the other conductivity type (p+conductivity type in this example) provided in the emitter region 1, an insulated gate 7 overlying a channel area 8 in the further region 6 and a source region 9 of the one conductivity type (in this example n+conductivity type) provided in the further region 6.

Metallization is provided on the surface 10' and 10" of the device to form the base, collector and source contacts 12, 13 and 14. As shown in FIG. 1, the metallization forming the source contact 14 also extends onto the surface of the source region 9 to short the p-n junction between the further region 6 and the source region 9 to suppress bipolar action therebetween. An insulating oxide layer 11 is provided on the surface 10' to protect the surface regions not covered by metallisation.

Thus, as mentioned above, the first insulated gate field effect transistor $T_2$ is merged with the bipolar transistor $T_1$ to provide a gateable connection to the emitter region 1 enabling current flow through the emitter region 1 to be controlled by a gate signal supplied to the insulated gate 7 so that when the bipolar transistor $T_1$ is turned off by a negative base signal applied to the base contact 12, the emitter region 1 can be open-circuited by applying a negative signal to the insulated gate 7 to turn off the transistor $T_2$, so forcing current to flow out through the collector-base circuit.

The gate and base signals may, of course, be derived from the same voltage source (not shown).

It will of course be appreciated that when the bipolar transistor $T_1$ and the first insulated gate field effect transistor $T_2$ are on or conducting, the p-n junction between the further region and the emitter region will be slightly reverse-biased, so inhibiting parasitic thyristor action of the pnpn structure formed by the collection, base, emitter and further regions.

The device shown in FIG. 1 includes a second insulated gate field effect transistor $T_3$ merged in the device to provide a charge extraction path from the base region 2 when the bipolar transistor $T_1$ is turned off.

As shown in FIG. 1, the second insulated gate field effect transistor $T_3$ is formed by an insulated gate 15 overlying a channel area $1a$ of the emitter region 1, the drain of the second insulated gate transistor $T_3$ being provided by a part of the base region 2 and the source of the second insulated gate field effect transistor being provided by part of the further region 6. The source region 9 is preferably omitted in the vicinity of the second insulated gate field effect transistor $T_3$ to facilitate flow of charge carriers (holes in the arrangement shown) through the second insulated gate field effect transistor $T_3$ to the source contact when the transistor $T_3$ is rendered conducting.

As will be appreciated from the above, the second insulated gate field effect transistor $T_3$ is of opposite polarity to the first insulated gate field effect transistor $T_2$ so that, as shown in FIG. 1 and 1a, the same gate signal can be used to switch on transistor $T_2$ and switch off the transistor $T_3$ (or vice versa). Thus, when the bipolar transistor $T_1$ is rendered non-conducting by a negative base signal, a negative gate signal applied to the insulated gates 7 and 15 of the first and second insulated gate field effect transistors $T_2$ and $T_3$ of the device shown in Figure 3 causes the transistor $T_2$ to be rendered non-conducting to open-circuit the emitter of the bipolar transistor $T_1$ forcing current to flow through the collector-base circuit while the transistor $T_3$ is at the same time rendered conducting to provide a charge extraction path from the base region 2 via the insulated gate field effect transistor $T_3$.

The device shown in FIG. 1 may have any desired geometry when viewed in plan. Thus, in the device shown in FIG. 1, the emitter and source regions 1, 6 and 9 may be rectangular, square, or circular in plan view.

The arrangement shown in FIG. 1 may be symmetrical about an axis shown by the dotted line 16 in FIG. 1 so as to provide a hollow emitter structure with the emitter, further and source regions 1, 6 and 9 then being in the form of annuli, for example rectangular or circular annuli.

FIGS. 2 and 2a illustrate a further embodiment of the invention in which the device shown in FIG. 1 has been modified to include a third insulated gate field effect transistor $T_4$ of complementary type to the second insulated gate field effect transistor $T_3$. The third insulated gate field effect transistor $T_4$ is provided to form a base drive for the bipolar transistor. The two complementary insulated gate field effect transistors $T_3$ and $T_4$ have a common gate connection so as to form a push-pull input stage for the base region 2 of the bipolar transistor $T_1$. Thus, the application of a positive gate signal to the insulated gates 15 and 18 renders transistor $T_4$ conducting to supply a base drive signal to the bipolar transistor $T_1$ while the application of a negative gate signal renders transistor $T_3$ conducting to enable base charge extraction from the bipolar transistor $T_1$.

As shown in FIG. 2, the third insulated gate field effect transistor $T_4$ is formed by an insulated gate 18 overlying a channel area $2a$ in the base region 2, a portion of the collector region 3 adjacent the channel area forming the drain of the transistor $T_4$ and a source region $19b$ of the one conductivity type (in this example n+conductivity type) provided in the base region 2 adjacent the channel area. The source region $19b$ can be formed in the same step as the source region 9. Metallization 20 is provided to short the p-n junction between the source region $19b$ and the base region 2 to prevent bipolar action therebetween. Thus a push-pull input stage has been provided while still maintaining a very compact merged arrangement and without the need for additional diffusion and/or ion implantation steps.

As in the case of the FIG. 1 embodiment, the device shown in FIG. 2 may be symmetrical about an axis shown in FIG. 2 by the dashed line 17 to provide a hollow emitter structure. In such an arrangement, the third insulated gate field effect transistor $T_4$ is preferably provided at a particular location of the base region 2 and does not extend around the entire periphery of the base region.

Figure 3A:
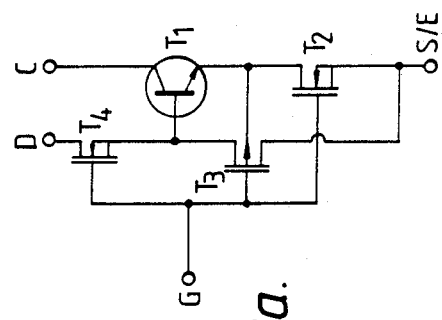
FIG. 3a illustrates the equivalent circuit for the device shown in FIG. 3.

FIGS. 3 and 3a; illustrate a modified version of the device shown in FIG. 2 and 2a in which the third insulated gate field effect transistor $T_4$ is provided on the left (as viewed in Figure 3a) adjacent the second insulated gate field effect transistor $T_3$ rather than on the right adjacent the first insulated gate field effect transistor. As shown in FIG. 3, the source region 19 is formed by a first region $19a$ of the one conductivity type (in this example n conductivity type) provided by use of an appropriate mask during the formation of the emitter region 1 and a second more highly doped region $19b$ of the same conductivity type (n+conductivity type) formed with the source region 9 using an appropriate mask. Of course one or other of the regions $19a$ and $19b$ may be omitted a in the arrangement shown in FIG. 2 where only region $19b$ is provided.

In the arrangement shown in FIGS. 3 and 3a, a separate connection to the drain of the third insulated gate field effect transistor $T_4$ to enable higher power operation is provided by forming a drain region 22 of the one conductivity type in the base region 2 alongside the source region 19. The drain region 22 has the same structure as the source region 19 and may, as shown, be formed by a first region $22a$ of the one conductivity type (n conductivity type in this case) formed with the emitter region 1 and a second more highly doped region $22b$ of the n conductivity type.(n+conductivity type in this case) formed at the same time as the source region 9. A drain contact 23 is formed by metallization.

The devices shown in FIGS. 1, 2 and 3 may be manufactured using existing power semiconductor technology. Thus, for example, the substrate or collector region 4 may be a highly doped n+conductivity type layer of monocrystalline silicon on which the collector region 3 is grown as a lowly doped epitaxial n−conductivity type layer. The p conductivity type base region 2 and the n conductivity type emitter region 1 may be formed by successive dopant diffusion or dopant ion implantation steps using appropriate dopants and photoresist masks at each stage. The dopant used to produce the p conductivity type base region 2 may be boron while the dopant used to produce the n conductivity type emitter region 1 may be phosphorous or arsenic. A highly doped p+type conductivity further region 6 may be formed in the emitter region 1 in a similar manner to the formation of the base region 2 in the collector region 3 using boron ion implantation and/or diffusion while a highly doped n+type conductivity source region 9 may be formed in the further region 6 in a manner similar the formation of the emitter region 1 in the base region 2 using arsenic (or phosphorous) ion implantation and/or diffusion, in each case using appropriate masks. With reference to the FIGS. 2 and 3 embodiments, the source region 19a (and drain region 22b in the FIG. 3 embodiment), when provided, may be formed using an appropriate mask in the same diffusion and/or ion implantation step as the emitter region 1 while the source region 19b (and drain region 22b in the FIG. 3 embodiment), when provided, may be formed using an appropriate mask in the same step as the source region 9, so that no diffusion and/or ion implantation steps additional to those used to produce the Figure 1 embodiment are required for the FIG. 2 and 3 embodiments, but merely a different mask arrangement.

The insulating layer 11 may be formed of silicon dioxide grown thermally over the surface of the epitaxial layer, the composition and thickness of the insulating layer at the region(s) where the insulated gate(s) is (are) to be provided being selected to provide the required gate dielectric. The insulated gate(s) is (are) formed on the insulating layer by deposition and patterning using a suitable gate material such as polycrystalline silicon doped, before or after deposition, to render it conductive. Contact windows are provided in the insulating layer 11 and conductive material, for example aluminum, is deposited to form the base and source contacts 12 and 14 (and in the FIG. 3 the drain contact 23) within the windows. The bottom surface 10″ of the substrate 4 is coated with metallization to provide the collector/drain contact 13. Thus, a device having just four (or in the case of FIG. 2 three) terminal connections is formed. With appropriate doping, a common base and insulated gate connection may be provided for the devices shown in FIG. 1 to produce a three, rather than four, terminal devices as indicated by the dashed connection lines in FIG. 1a.

The devices described above have, when compared with a simple bipolar transistor, a fast turn-off resulting from the merging with the bipolar transistor $T_1$ of the first and second insulated gate field effect transistors $T_2$ and $T_3$ and, as compared with a simple insulated gate field effect transistor, have the advantage of minority carrier injection resulting from the provision of the bipolar transistor $T_1$ which reduces the ON resistance. The devices shown in FIGS. 2 and 3 have the further advantage of high input impedance because of the provision of the base drive transistor $T_4$. However, in each case, the device arrangement is extremely compact and the number of terminals required is low, normally four.

As will be appreciated, the bipolar transistor $T_1$ described above may form part of a large bipolar device, for example a thyristor structure. Thus in the devices described above, the n+substrate 4 may be replaced by a p conductivity type substrate to form a pnpn structure so that the bipolar device may be a thyristor, for example a gate turn-off thyristor GTO or a four layer diode, if the base connection is omitted. Further, although the insulated gate field effects transistors shown in FIGS. 1, 2 and 3 have their respective insulated gates formed on the surface 10′, at least some of these field effect transistors may have insulated gates formed on side walls of grooves in the surface 10′.

From reading the present disclosure, other modifications will be apparent to persons skilled in the art. Such modifications may involve other features which are already known in the design of semiconductor devices and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization or modification of one or more of those features which would be apparent to persons skilled in the art, whether or not it relates to the same invention as presently claimed in any claim and whether or not it mitigates any or all of the same technical problems as does the present invention.

We claim:

1. A semiconductor device comprising a bipolar transistor having an emitter region of one conductivity type, a base region of the opposite conductivity type in contact with said emitter region, and a collector region of the one conductivity type in contact with said base region, a first insulated gate field effect transistor, having a channel region for providing a switchable connection to the emitter region of the bipolar transistor, and a second insulated gate field effect transistor having a source region of said opposite conductivity type and a channel region for providing a charge extraction path from the base region when the bipolar transistor is turned off, the first insulated gate field effect transistor comprising a source region, a further region of the opposite conductivity type provided in the emitter region for separating said source region and said emitter region, and an insulated gate which overlies said channel region of the first transistor, said channel region comprising at least part of the further region between the emitter region and the source region of the first insulated gate field effect transistor to provide the switchable connection, and the second insulated gate field effect transistor comprising an insulated gate overlying said channel region of the second insulated gate field effect transistor, which includes at least part of the emitter region adjacent the base region to provide a switchable connection between the base region and the source region of the second insulated gate field effect transistor to provide the charge extraction path from the base region via the second insulated gate field effect when the bipolar transistor is turned off.

2. A semiconductor device according to claim 1, wherein the source of the first insulated gate field effect transistor comprises a source region of the one conductivity type provided in the further region.

3. A semiconductor device according to claim 1 or 2, wherein the source of the second insulated gate field effect transistor comprises a source region of the opposite conductivity type provided in the emitter region.

4. A semiconductor device according to claim 3, wherein the source region of the second insulated gate field effect transistor also comprises the further region.

5. A semiconductor device according to claim 1 or 2 wherein a third insulated gate field effect transistor is provided of complementary conductivity type to said second insulated gate field effect transistor, the second and third insulated gate field effect transistors having a common gate connection to form a push-pull input stage for the base region of the bipolar transistor, the third insulated gate field effect transistor comprising an insulated gate overlying a channel area comprising part of the base region to provide a switchable connection between a drain region of the one conductivity type of the third insulated gate field effect transistor and a source region of the one conductivity type electrically connected to the base region.

6. A semiconductor device according to claim 5, wherein the drain region of the third insulated gate field effect transistor comprises at least part of the collector region of the bipolar transistor.

7. A semiconductor device according to claim 5, wherein the drain region of the third insulated gate field effect transistor comprises a drain region of the one conductivity type provided in the base region of the bipolar transistor.

8. A semiconductor device according to claim 5, wherein the source region of the third insulated gate field effect transistor comprises a source region of the one conductivity type formed in the base region of the bipolar transistor.

9. A semiconductor device according to claim 1 or 2, wherein the collector region of the bipolar transistor is provided in contact with a region of the opposite conductivity type so that the bipolar transistor forms part of a thyristor structure.

10. A semiconductor device according to claim 1 or 2, wherein a common connection is provided to the base region of the bipolar transistor and the insulated gates of the insulated gate field effect transistors.

* * * * *